(12) United States Patent
Samsoniuk et al.

(10) Patent No.: US 11,171,653 B2
(45) Date of Patent: Nov. 9, 2021

(54) METHOD FOR PROGRAMMING A FIELD PROGRAMMABLE GATE ARRAY AND NETWORK CONFIGURATION

(71) Applicant: Unify Patente GmbH & Co. KG, Munich (DE)

(72) Inventors: Marcelo Samsoniuk, Curitiba (BR); Paolo Henrique Bernardi, Curitiba (BR); Diogo Wachtel Granado, Curitiba (BR)

(73) Assignee: Unify Patente GmbH & Co. KG, Munich (DE)

( * ) Notice: Subject to any disclaimer, the term of this patent is extended or adjusted under 35 U.S.C. 154(b) by 0 days.

(21) Appl. No.: 16/957,428

(22) PCT Filed: Dec. 28, 2017

(86) PCT No.: PCT/EP2017/084777
§ 371 (c)(1),
(2) Date: Jun. 24, 2020

(87) PCT Pub. No.: WO2019/129354
PCT Pub. Date: Jul. 4, 2019

(65) Prior Publication Data
US 2020/0321965 A1 Oct. 8, 2020

(51) Int. Cl.
*H03K 19/17704* (2020.01)
*H03K 19/17736* (2020.01)
(Continued)

(52) U.S. Cl.
CPC ... *H03K 19/17764* (2013.01); *H03K 19/1776* (2013.01); *H03K 19/17712* (2013.01); *H03K 19/17744* (2013.01)

(58) Field of Classification Search
None
See application file for complete search history.

(56) References Cited

U.S. PATENT DOCUMENTS 6,326,806 B1 12/2001 Fallside et al.
7,696,781 B1 * 4/2010 Burney ............ H03K 19/17732
326/38

(Continued)

OTHER PUBLICATIONS

International Search Report for PCT/EP2017/084777 dated Sep. 27, 2018.

(Continued)

*Primary Examiner* — Anh Q Tran
(74) *Attorney, Agent, or Firm* — Buchanan Ingersoll & Rooney PC

(57) ABSTRACT

A method for programming a Field Programmable Gate Array (FPGA) via a network, the network being operated according to a predetermined communications protocol, can include: establishing a communication connection between the FPGA and an external master, setting the FPGA into a programming mode, the master providing an FPGA programming image to the FPGA in a sequence of frames so that the frames can be parsed and enabling the FPGA to write only during receiving the payload section of the frames. The FPGA programming image and parsing the sequence of frames can be performed by a permanently programmed or hardwired logic component. A network, FPGA, and a communication system can be configured to utilize embodiments of the method.

19 Claims, 13 Drawing Sheets

(51) Int. Cl.
*H03K 19/1776* (2020.01)
*H03K 19/17764* (2020.01)

(56) References Cited

U.S. PATENT DOCUMENTS 8,224,638 B1 * 7/2012 Shirazi .................... G06F 30/34
  703/16
9,698,793 B1   7/2017 Aden et al.

OTHER PUBLICATIONS

Written Opinion of the International Search Authority for PCT/EP2017/084777 dated Sep. 27, 2018.
Vaibhawa Mishra et al., "REoN: A Protocol for Reliable Software-Defined FPGA Partial Reconfiguration Over Network", 2016 International Conference on Reconfigurable Computing and FPGAS (Reconfig), Nov. 1, 2016, p. 1-7, XP55507583.
Alachiotis, N., et al., "Efficient PC-FPGA Communication Over Gigabit Ethernet", Computer and Information Technology (CIT), 2010 IEEE 10th International Conference on, IEEE, Piscataway, NJ, USA, Jun. 29, 2010, pp. 1727-1734, XP031757564.
Alachiotis, N., et al., "A Versatile UDP/IP Based PC FPGA Communication Platform" Reconfigurable Computing and FPGAS (Reconfig), 2012 International Conference On, IEEE, Dec. 5, 2012, pp. 1-6, XP032314203A.
International Preliminary Report on Patentability for PCT/EP2017/084777 dated Jun. 30, 2020.

* cited by examiner

METHOD FOR PROGRAMMING A FIELD PROGRAMMABLE GATE ARRAY AND NETWORK CONFIGURATION

CROSS-REFERENCE TO RELATED APPLICATIONS

This application is the U.S. national stage application of International Patent Application No. PCT/EP2017/084777 filed on Dec. 28, 2017.

FIELD

The present invention relates to a method for programming a Field Programmable Gate Array via a network, and a network configuration for carrying out the method.

BACKGROUND

In prior art so-called Field Programmable Gate Arrays (FPGA) are known which are integrated circuits designed for being configured (i.e., customized for their function) by a user or customer. The configuration may be modified (updated) several times. Usually, the FPGA configuration (or programming) is specified using a Hardware Description Language (HDL). This can be done in the booting process. For booting an FPGA directly, in prior art, a parallel or serial external non-volatile memory is required. Accordingly, the remote update of the non-volatile memories directly attached to the FPGA is possible via the following two ways:

1) Indirect Update Via Joint Test Action Group (JTAG)
Since the FPGA is not operative when the non-volatile memory is updated via the JTAG chain, the operation must be performed by an external device connected to the network (typically a computer running the FPGA tools). However, regardless the performance of this device, the JTAG chain is very slow and the process is very disruptive, since the FPGA features are not available when the update via JTAG is performed.

2) Direct Update Via FPGA Itself:
Since the FPGA is directly connected to the non-volatile memory, it is possible to embed an operable processor inside the FPGA and directly update the image in the non-volatile memory without affecting the FPGA operation. Although less disruptive and faster when compared to the update via JTAG, this approach is slowed down by the non-volatile memory. Since the FPGA must be programmed, the non-volatile memory must include a scheme of dual boot images so as to always be able to provide a rescue image if the main image fails for some reason, although there is no guarantee that it is possible to activate the rescue image in case the main image is not working properly or in such a case when the FLASH is completely erased by accident. In the latter case, the only way to restore the FPGA operation is using the indirect update via JTAG.

In order to enable a more dynamical environment and avoid the limitations of the non-volatile storage technology, some FPGAs boot from a parallel or serial external master, such as a microprocessor or microcontroller.

In this case, the external master downloads the FPGA image from the local non-volatile memory, volatile memory which is faster, or from the network which is preferable with respect to flexibility and manageability. Then, the image is directly transferred directly to the FPGA. Although more flexible and faster than booting from a directly attached non-volatile memory, most low-cost microprocessors and microcontrollers are not fast enough to support the state of the art network technology (1 Gbps or above); rather, only older and slower network speeds are supported (10 or 100 Mbps). Although faster microcontrollers are available, their implementation has the disadvantage of increasing the overall costs. Also, regardless the microcontroller performance, a further disadvantage is that the additional components increase the board space usage, complexity and costs.

SUMMARY

An FPGA update with technology known from prior art involves the following problems. First of all, an indirect update via JTAG is too slow and requires a complex external device. Secondly, a direct update via the FPGA is problematic, since the speed is limited due to the directly attached non-volatile memory. Additional steps, as FPGA restart from the FLASH, are required. Also, manageability problems might occur, since the FPGA is unable to boot from a cleared FLASH. Also, direct update via an auxiliary processor will increase the board space and complexity and, therefore, costs will increase.

Therefore, the present invention is based on the object to provide a method for programming an FPGA via a network and a corresponding network configuration according to which the problems concerning performance, complexity, costs and manageability outlined above are overcome. This object is solved by embodiments of a method for programming an FPGA, embodiments of a network configuration, and an FPGA.

Accordingly, a method for programming a Field Programmable Gate Array (FPGA) via a network is provided, the network being operated according to a predetermined communications protocol, wherein embodiments of the method can include the steps of:
establishing, via the network, a communications connection between the FPGA to an external master in the network;
setting the FPGA into a programming mode;
receiving an FPGA programming image for programming the FPGA, the FPGA programming image being transmitted from the external master to the FPGA according to the predetermined network communications protocol in a sequence of frames, each frame comprising a payload section and protocol overhead section, each payload section comprising a portion of the programming image,
parsing the sequence of frames, and
enabling FPGA writing only during receiving the payload section of each of the frames received and writing the portion of the programming data of the payload section into the FPGA,
wherein the steps of receiving the FPGA programming image and parsing the sequence of frames is performed by a permanently programmed or hardwired logic component.

By use of embodiments of the inventive method, the problems regarding the performance, complexity, costs and manageability are overcome by creating a scheme for the FPGA being able to boot itself directly from the network with minimal external electronic devices and the maximum allowed performance, regardless the internal state, i.e., programmed or not programmed. In embodiments of the inventive method, for parsing the sequence of frames, the use of a minimal logic between the FPGA and the network is proposed which in the following is referred to as glue-logic, and by the implementation of which the inherent complexity of the network technology can be managed, whereby different degrees of manageability and security are enabled, thus, reducing the board space requirements and the overall costs.

By use of a permanently programmed or hardwired logic component, the use of a microprocessor, always requiring loading a software program to be executed, can be avoided. Instead, the permanently programmed or hardwired logic component is adapted to fulfill its task directly as defined by its internal logic.

According to a preferred embodiment, the predetermined network communications protocol is an Ethernet protocol.

According to another preferred embodiment, the method further comprises the steps of
  assuming, by the FPGA, after a predetermined number of frames, which are sufficient for loading a valid FPGA configuration image has been received, the control of an interface, in particular, a gigabit media-independent Interface (GMII), between the external master and the FPGA, and starting exchange traffic with the external master.

Further, it is advantageous, if the method comprises a step of disabling the FPGA image download after starting exchange traffic.

Preferably, the external master is a network server with an Ethernet PHY directly attached thereto.

According to still a further preferred embodiment, the logic component, in particular, the glue logic, comprises a digital counter and at least one comparator being provided between the Ethernet PHY and the FPGA, the glue logic, during the programming phase of the FPGA, generating an RXWR signal from a receive clock RXCLK and a bit RXEN received from the Ethernet physical layer (PHY). The logic component can be circuitry (e.g. glue logic type, etc.).

According to still a further preferred embodiment, the logic component, in particular, the glue logic, comprises a digital counter and at least one comparator being provided between the Ethernet PHY and the FPGA, the glue logic, during the programming phase of the FPGA, generating a Receive Write signal RXWR while the counter, in particular, a 10-bit counter, is between a defined range $\tau$ and $\tau+\varepsilon$, where $\varepsilon$ is the payload length and the value is the number of bytes to be skipped, since these bytes are used by the network headers that are not part of the FPGA image payload. The counter is an n-bit counter, in particular, an 10-bit counter, where n is enough to count to $2^n$ and must be more than the maximum frame length, in a way that counter is incremented by the Receive Clock signal RXCLK and enabled while the Receive Data Valid signal RXDV received from the Ethernet PHY is enabled. When the RXDV is not enabled, the counter is fixed in a reset state with a value 0, which results in the comparator keeping the RXWR signal disabled. As the FPGA only receives data when RXWR is enabled, the FPGA will correctly receive only the payload part of the Ethernet frame.

The step of parsing the sequence of frames may be carried out by the glue logic. Preferably, the logic component is of a glue logic type, PLA type, or PLD type or any other adequate type. The glue-logic itself can be composed by a single or multiple components, depending of the degree of manageability and security required.

However, here, no intelligent devices are required. The glue-logic solution is very deterministic, much faster and may be a hardware only solution, i.e., no processor and/or software required in the glue-logic, which meets the requirements for complexity and costs. Moreover, less board space and less support efforts are needed, such as support for embedded software.

It is also preferable, if the method further comprises a step of re-programming the FPGA, wherein the FPGA erases itself, in particular, by triggering an IO pin connected to a RESET pin so as to stop exchange traffic between the FPGA and the external master.

Moreover, embodiments of a network configuration are provided, comprising a communications network, in which an external master and an FPGA are connected to each other via an interface, and are adapted to communicate with each other according to a predetermined network communications protocol, wherein the FPGA is adapted to boot itself directly from the network, and wherein the network configuration further comprises glue logic comprising a counter and at least one comparator, the glue logic being provided between the FPGA and the interface.

Further, the external master may be a network server, the predetermined network communications protocol is Ethernet, and wherein the interface is a GMII interface. The external master can be a computer device that has hardware that includes at least one processor and a non-transitory computer readable medium connected to the processor (e.g. non-transitory memory). The FPGA also includes hardware including at least one processor and/or a non-transitory computer readable medium.

According to a preferred embodiment, the glue logic further comprises discrete high speed logic and/or an auxiliary component with a pre-programmed programming image, the auxiliary component being an auxiliary Complex Programmable Logic Device CPLD, an auxiliary FPGA, or an auxiliary Application-Specific Integrated Circuit ASIC.

The auxiliary component may be integrated in the main FPGA as a dedicated component in the FPGA silicon.

It is advantageous, if the configuration is adapted to support layer-1, in particular, physical layer protocol, layer-2, in particular, VLAN protocols, layer-3, in particular, routing protocols such as IPv4 or IPv6, and layer-4, in particular, transport protocols such as User Datagram Protocol (UDP) or Transmission Control Protocol (TCP).

Other details, objects, and advantages of the invention will become apparent as the following description of certain exemplary embodiments thereof and certain exemplary methods of practicing the same proceeds.

BRIEF DESCRIPTION OF THE DRAWINGS

The invention and embodiments thereof are described in connection with the drawings illustrating exemplary embodiments of the method, network, and field programmable gate array apparatus. It should be appreciated that like reference numbers used in the drawings may identify like components.

REFERENCE NUMERALS USED IN THE DRAWINGS INCLUDE

Figure 1:
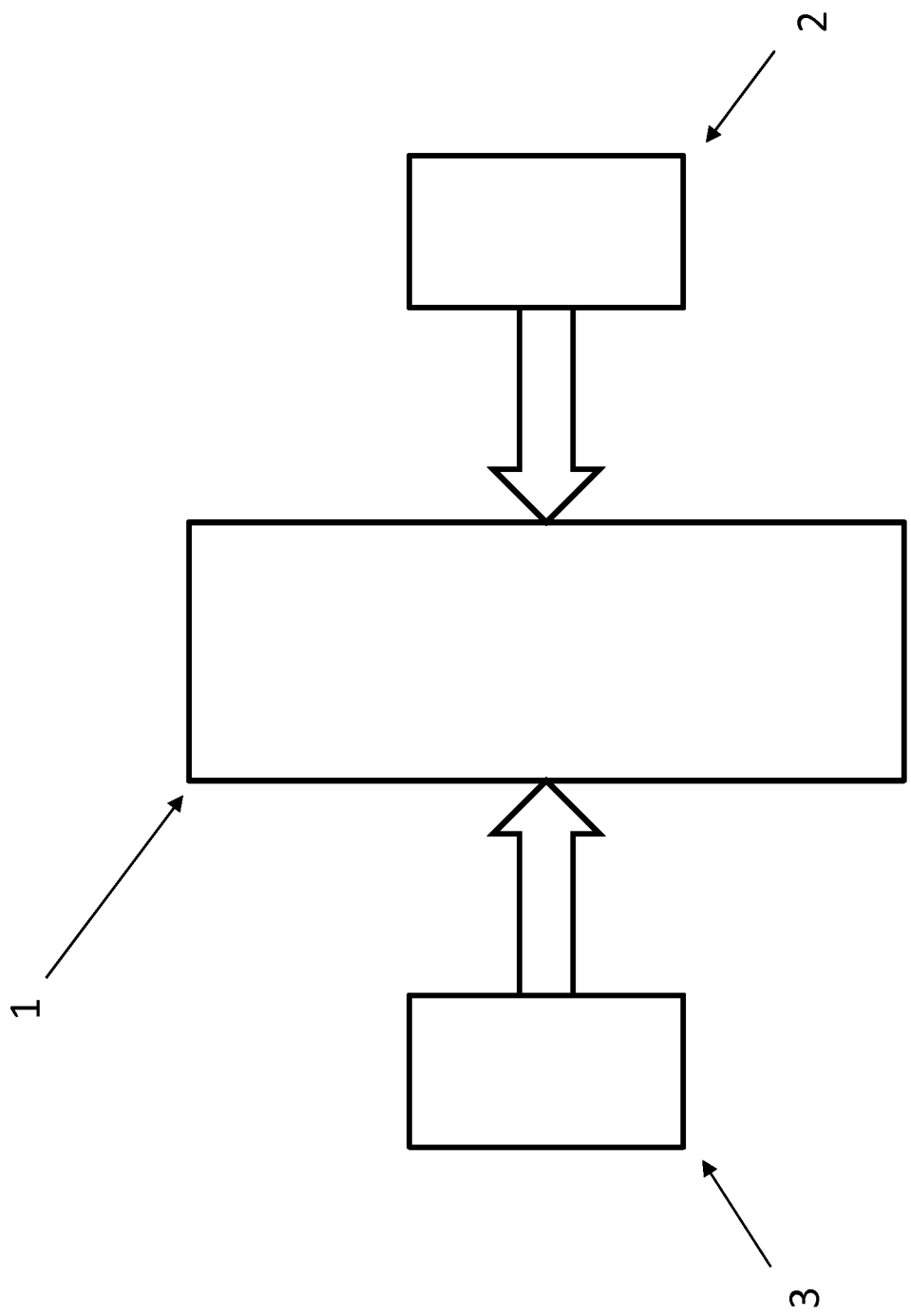
FIG. 1 shows an FPGA with external non-volatile boot memory according to prior art.

1 FPGA
1' 4×FPGA group
2 non-volatile memory
3 JTAG
4 microprocessor
5 network configuration
6 communications network
7 glue-logic
8 Ethernet PHY
9 external master
10 high speed network connection
11 high speed digital bus
12 frame
13 counter
14 comparator
15 datacenter structure
16 processor unity or switch
17 backplane
18 shelf

DETAILED DESCRIPTION

FIG. 1 shows an FPGA 1 with external non-volatile boot memory 2 according to prior art. As already explained above, most FPGAs known from prior art are able to boot directly from a parallel or serial external non-volatile memory 2, wherein the remote update of the non-volatile memories 2 which is directly attached to the FPGA 1 is possible in two ways. Either, an indirect update is possible via JTAG 3, as described above and resulting in a disruptive operation of the FPGA 1, or a direct update of the FPGA 1 is possible via the FPGA 1 itself, as also described before, resulting in slow operation of the FPGA 1.

Figure 2:
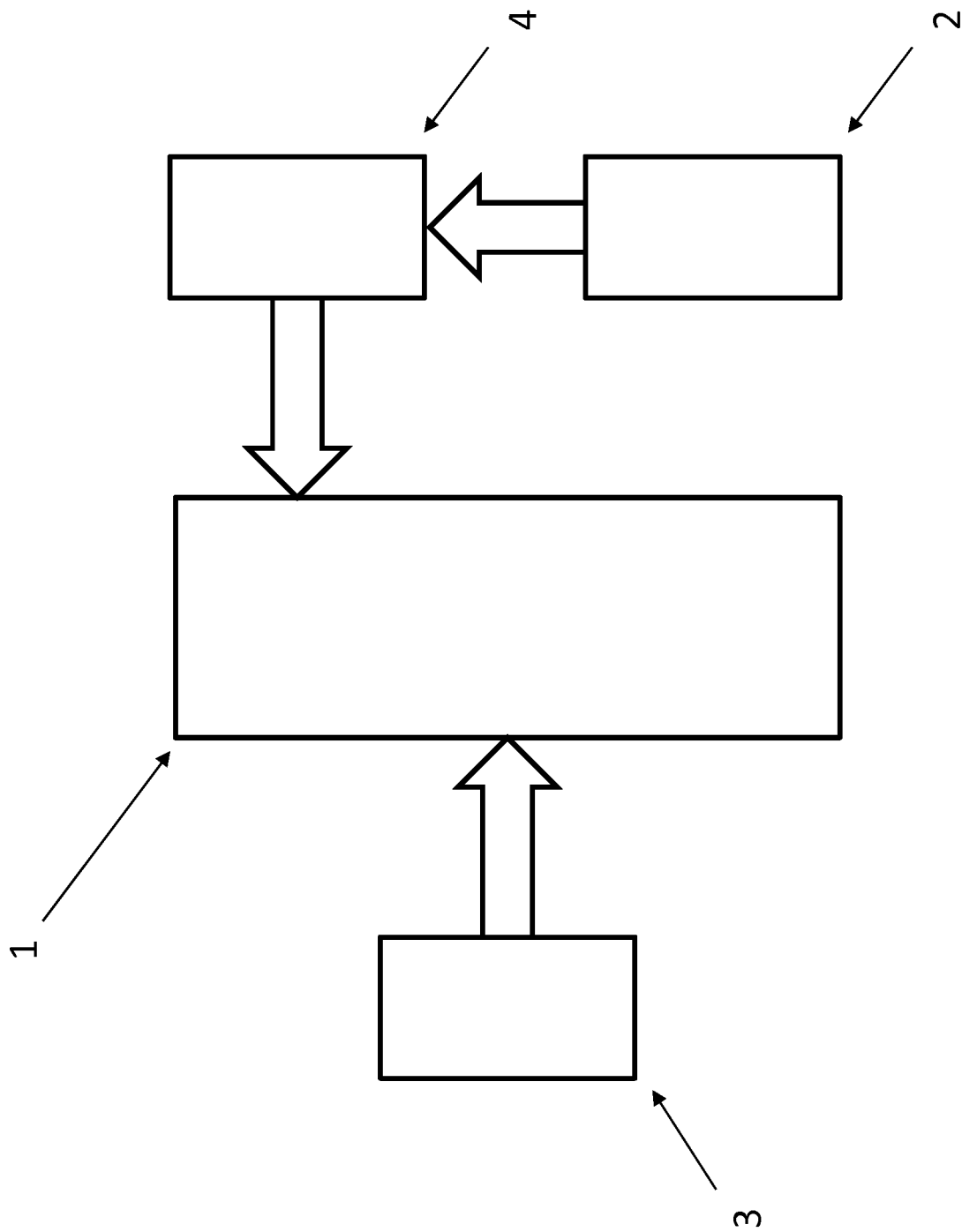
FIG. 2 shows a further FPGA according to prior art.

FIG. 2 shows a further FPGA 1 according to prior art, which compared to the configuration shown in FIG. 1 enables a more dynamical environment. Here, the FPGA 1 boots from a parallel or serial external master, such as a microprocessor or microcontroller 4 which downloads the FPGA programming image either from the local non-volatile memory, a volatile memory, or from a network, and transfers the FPGA programming image directly to the FPGA 1.

Figure 3:
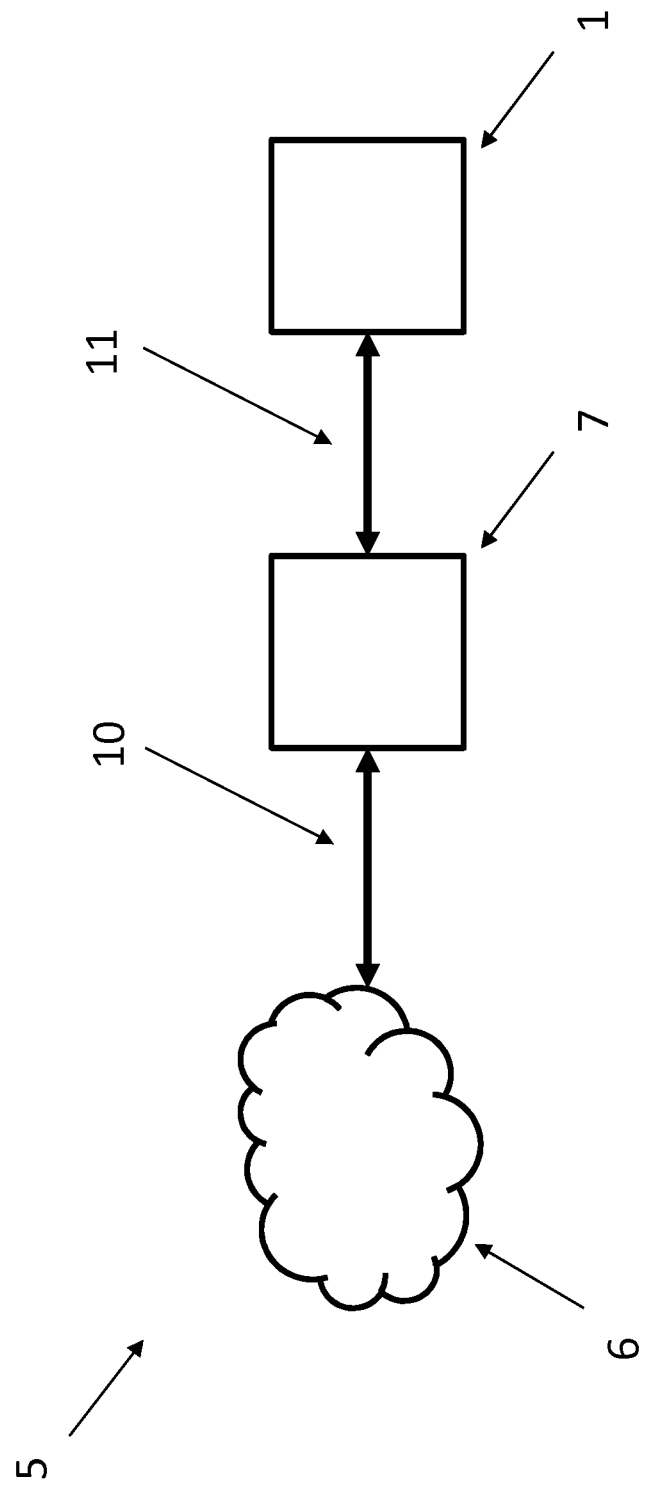
FIG. 3 shows a schematic view of a network configuration according to an embodiment of the invention.

FIG. 3 shows a schematic view of a network configuration 5 according to an embodiment of the invention illustrated in the most schematic and simple manner, but revealing the basic idea of the present invention. Namely, as can be seen in the figure, between the communications network 5 and the FPGA 1, there is provided glue-logic 7 which represents minimal logic but which enables the FPGA 1 to directly boot from the communications network 5 with maximum allowed performance, regardless the internal state, namely, a programmed state or an un-programmed state. The provision of the glue logic 7 enables handling the inherent complexity of the network technology and provides different degrees of manageability and security, reducing the board space requirements and the overall costs. The glue-logic 7 itself can be composed of a single or multiple components, depending on the degree of manageability and security required. However, as can be seen from FIG. 3, no intelligent devices are required; thus, this arrangement is very deterministic. Also, it is faster than configurations known from prior art and it may be a hardware only solution, without using a processor and/or software in the glue-logic 7.

Figure 4:
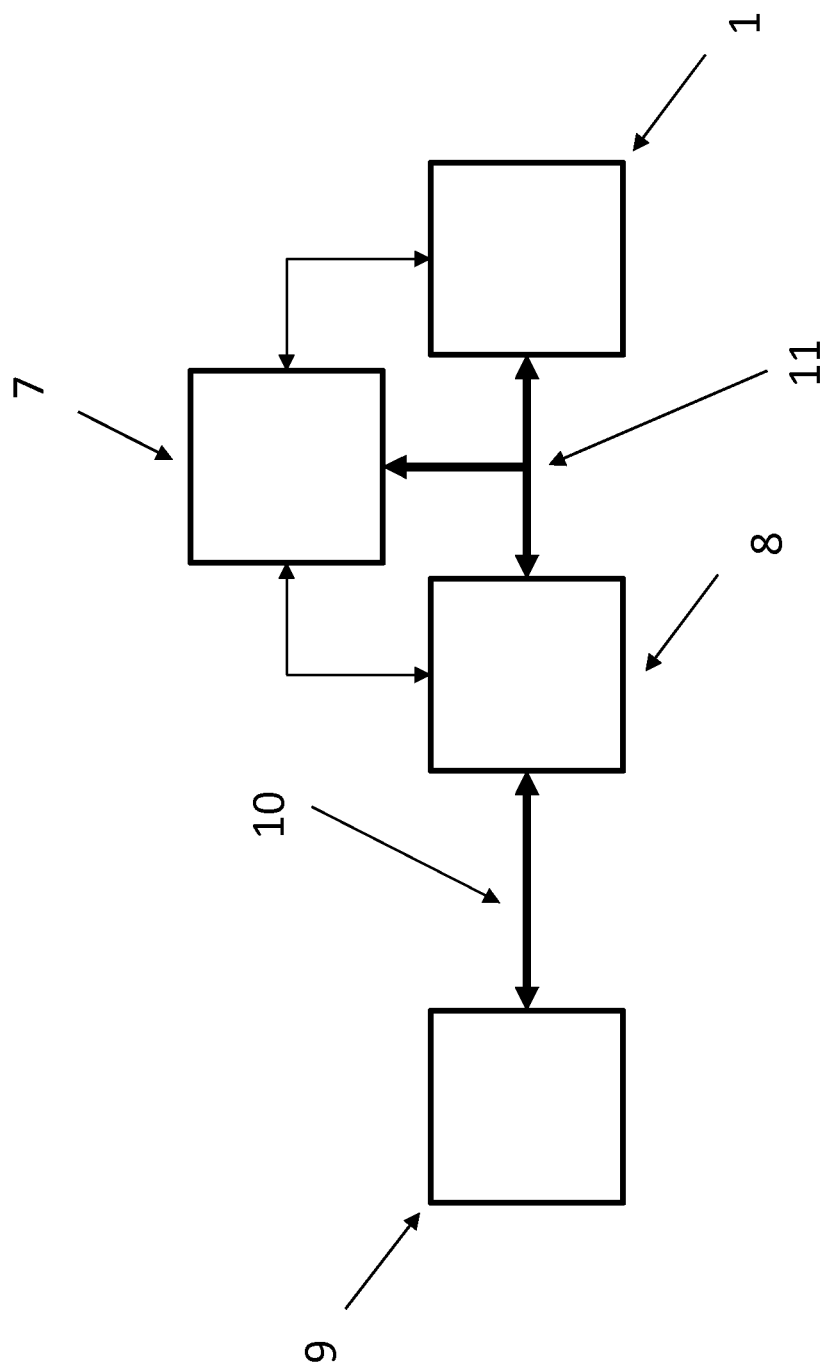
FIG. 4 shows a further schematic view of a network configuration according to an embodiment of the invention.

FIG. 4 shows a further schematic view of a network configuration 5 according to an embodiment of the invention. This embodiment actually illustrates the most basic setup, including a communications network 6, the FPGA 1 and interposed there between, glue-logic 7. Here, one single FPGA 1 is used with the glue-logic 7 and an Ethernet PHY 8 directly attached to an external master 9, which in the embodiment shown here is a network server which provides the FPGA programming image via a high speed network connection 10. Further, the PHY 8 and the FPGA 1 are connected to each other via a high speed digital bus 11.

Figure 5:
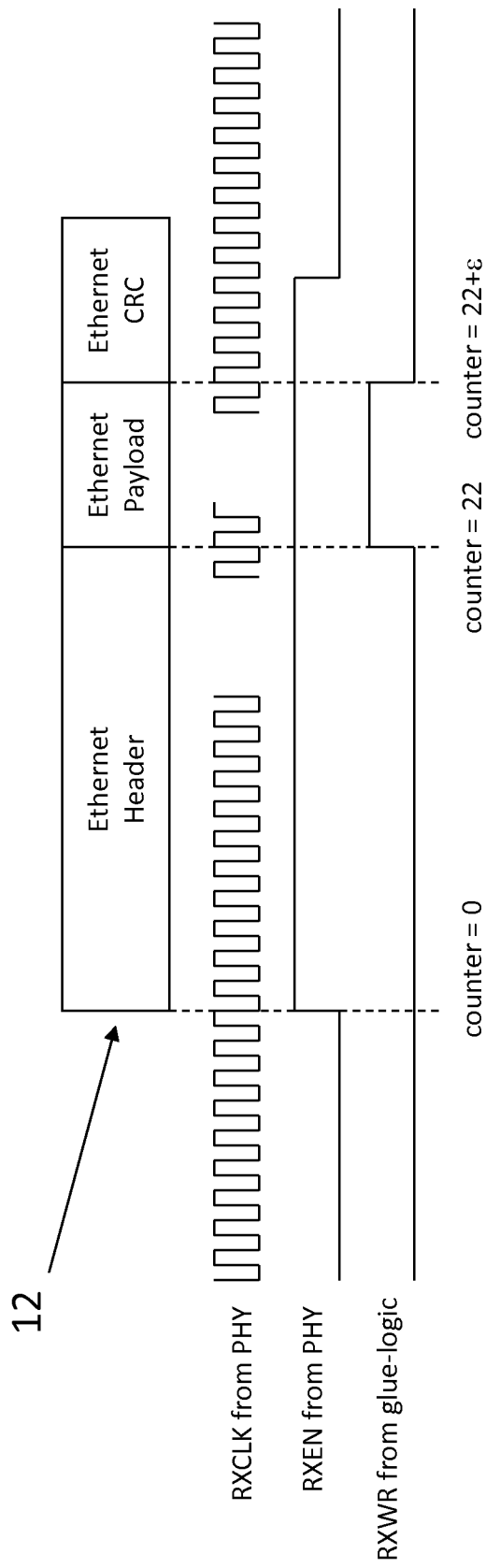
FIG. 5 shows a scheme for basic Ethernet Layer-2 support according to an embodiment of the invention.

Since the FPGA 1 or the PHY 8 itself are unable to perform all the required processing to extract the frame payload, a minimal glue-logic 7 is required in order to correctly bypass the initial frame preambles, the MAC addresses, the frame length and, of course, the frame checksum at the end, which requires the definition of a specific payload size, as will be further described in FIG. 5.

FIG. 5 shows a scheme for basic Ethernet Layer-2 support according to an embodiment of the invention. Illustrated here is a frame 12 according to Ethernet standard including a preamble having a field length of 7 bytes, a start of frame having a field length of 1 byte, a destination address of 6 bytes, a source address of 6 bytes, a length field of 2 bytes, a payload field including header and data according to IEEE 802.2 standard which may have a variable length between 46 and 1500 bytes, and a frame check sequence having a field length of 4 bytes. Immediately below the field length indication, the Receive Clock signal RXCLK from the PHY 8 is shown, the RXEN from the PHY 8, and the RXWR signal from the glue-logic 7. A counter implemented in the glue-logic 7, which will be further described below with respect to FIG. 6, starts counting when a frame is received. In the example shown here, when the counter has counted 22 bytes, this indicates that the next bytes will comprise payload. Then the counter counts the length of the payload, indicated by 22+ε, and on the basis of these counts, the signal RXWR is generated by the glue-logic 7 at the time of the payload only.

Figure 6:
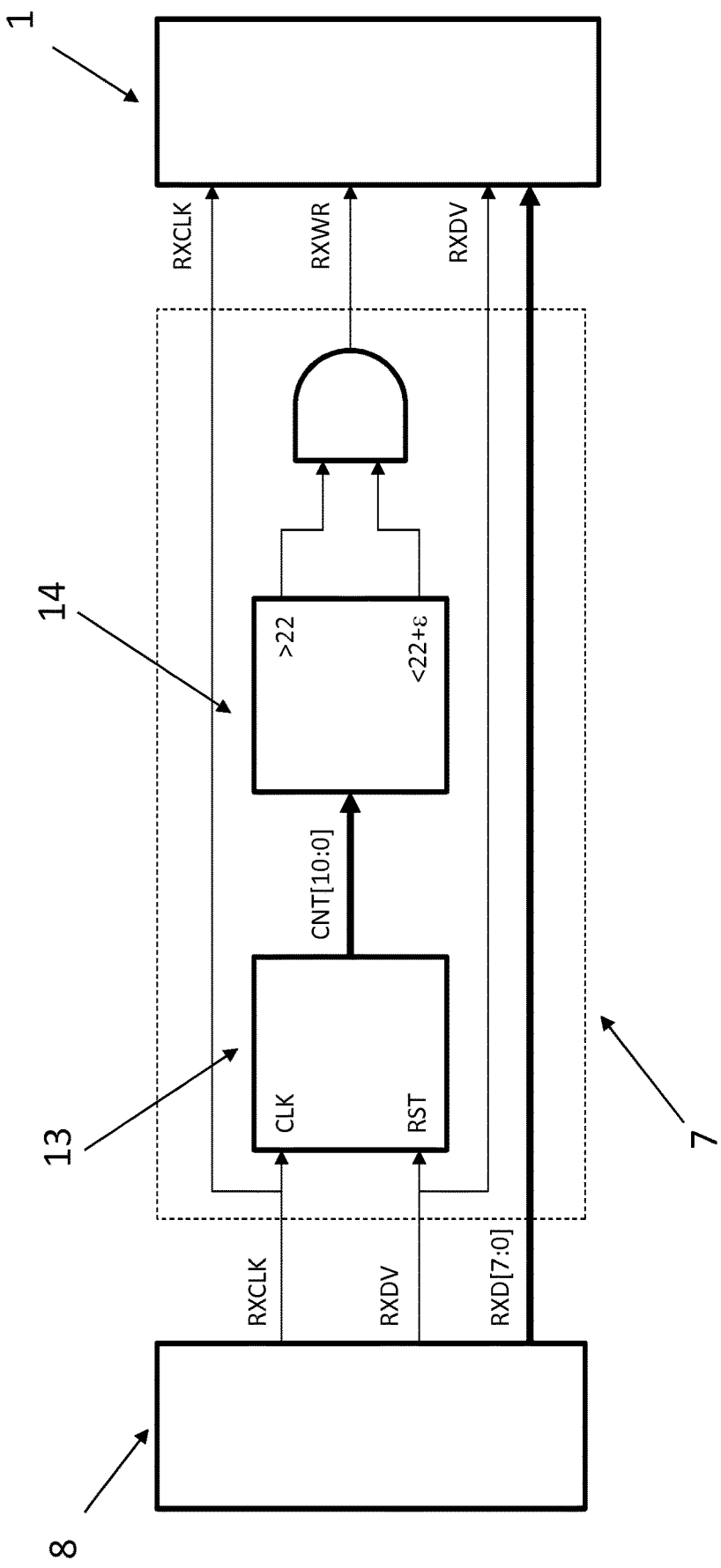
FIG. 6 shows a schematic view of glue logic according to an embodiment of the invention.

FIG. 6 shows a schematic view of the glue logic 7 according to an embodiment of the invention which is interposed between the PHY 8 and the FPGA 1. The glue-logic 7 according to this embodiment represents the simplest configuration of glue-logic. Namely, here, in order to bypass those areas in the payload, a high speed digital counter 13 is used and is compared by a comparator 14 with certain values, in a way that it is possible to enable and disable the FPGA processing of the payload in order to extract only the payload valuable for the FPGA 1 and bypass the frame structure.

Although the standard Ethernet defines up to 1500 bytes, the Ethernet with support for jumbo frames can transfer up to 9000 bytes and payload with large sizes is possible in faster versions of the Ethernet. Anyway, just as an example, the most basic Ethernet frame with up to 1500 bytes will require only 11 bits in the digital counter. Since the GMII interface can provide data at the rate of 125 Mbytes/second, the glue-logic 7 must work at least up to 125 MHz. Otherwise, the glue-logic 7 has to be designed such that it takes both the maximum frame size and the maximum data rate into account.

In this embodiment, after the power up, the FPGA 1 will automatically enter in a programming mode and will wait for payload. The server, for example, the network server 9 shown in FIG. 4, will detect that the FPGA 1 is not programmed by timeout and will continuously try downloading the FPGA programming image by sending the frames with the FPGA programming image payload. The PHY 8 will receive the frames 12 and the glue-logic 7 will activate the FPGA writing only at the correct moments. After a certain number of frames 12 have been received, the FPGA 1 will assume the GMII interface control, and will start exchange traffic with the server 9, disabling the continuously FPGA programming image download.

If the download was not successful for some reason, the server 9 will try again shortly thereafter until the FPGA 1 is operating correctly. Since there is no non-volatile memory, the intrinsic checking mechanism in the FPGA 1 is enough to ensure a non-valid FPGA programming image will be not loaded. In this case, the FPGA 1 will be not loaded and the server 9 will try again until a valid FPGA programming image is transmitted, and the FPGA 1 starts to exchange traffic. If the FPGA 1 needs to be reprogrammed for some reason, the FPGA 1 is able to erase itself by triggering an IO pin connected to the RESET pin, not shown, so that the traffic ceases and the server 9 detects the FPGA timeout, restarting the programming cycle.

Due to simplicity, is not possible to erase the FPGA 1 when the FPGA 1 lost the GMII interface control or downloads a specific image to a specific FPGA only. In this case a more complex glue-logic 7 is needed, capable to analyse upper layers whereby additional headers can be used to instruct FPGA programming and allow a faster way to erase and/or program the FPGA 1 directly by the network 6.

Figure 7:
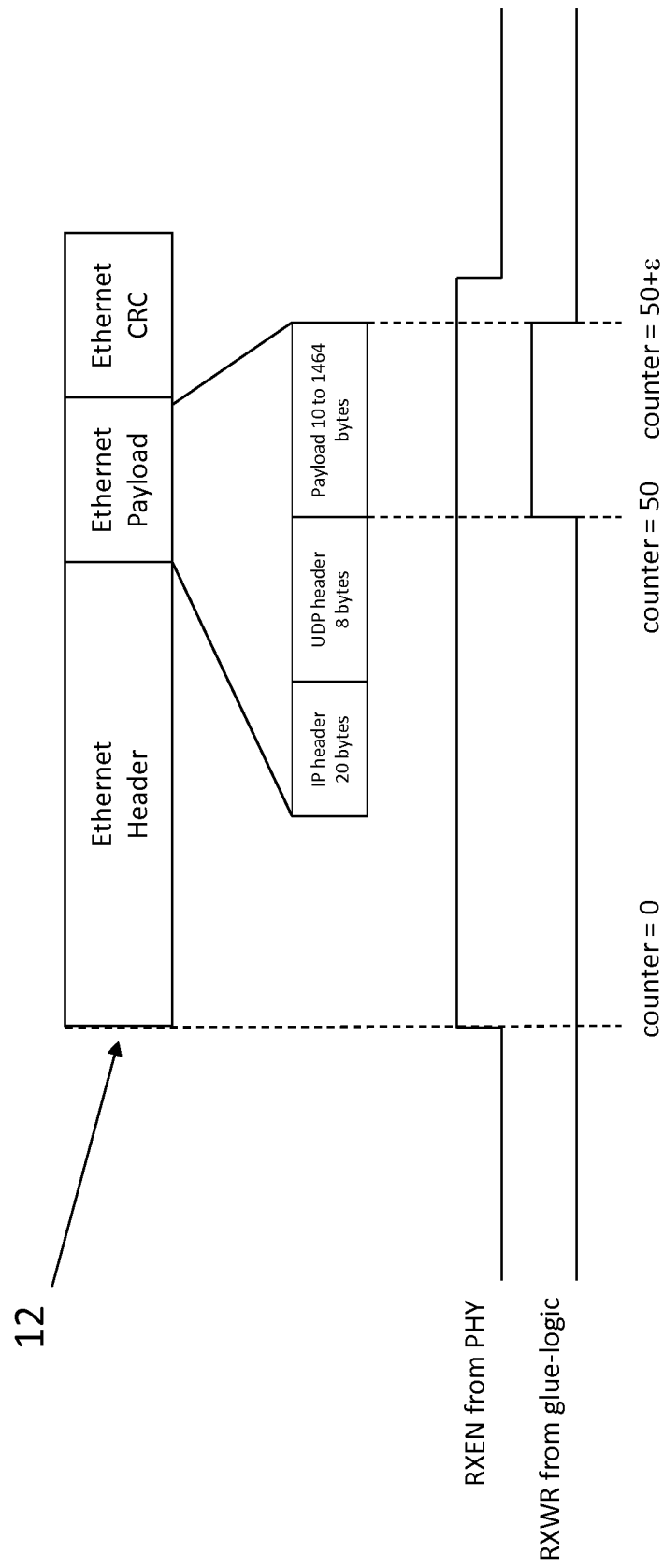
FIG. 7 shows a scheme for Layer-2/3/4 support for Ethernet/IP/UDP compatibility according to an embodiment of the invention.

FIG. 7 shows a scheme for Layer-2/3/4 support for Ethernet/IP/UDP compatibility according to an embodiment of the invention. Thus, according to this embodiment, a more complex stack of layer-2 (VLAN protocols), layer-3 (routing protocols, such as IPv4 or IPv6) and layer-4 (transport protocols, such as UDP or TCP) can be easily supported.

As can be seen here, a frame 12 includes a preamble having a field length of 7 bytes, a start of frame having a field length of 1 byte, a destination address of 6 bytes, a source address of 6 bytes, a length field of 2 bytes, a payload field including an IP header of 20 bytes, a UDP header of 8 bytes and payload between 10 and 1464 bytes, and a frame check sequence having a field length of 4 bytes. Immediately below the field length indication, the RXEN from the PHY 8, and the RXWR signal from the glue-logic 7 are shown. In the example shown here, the payload data are received between 50 bytes and 50+ε.

Figure 8:
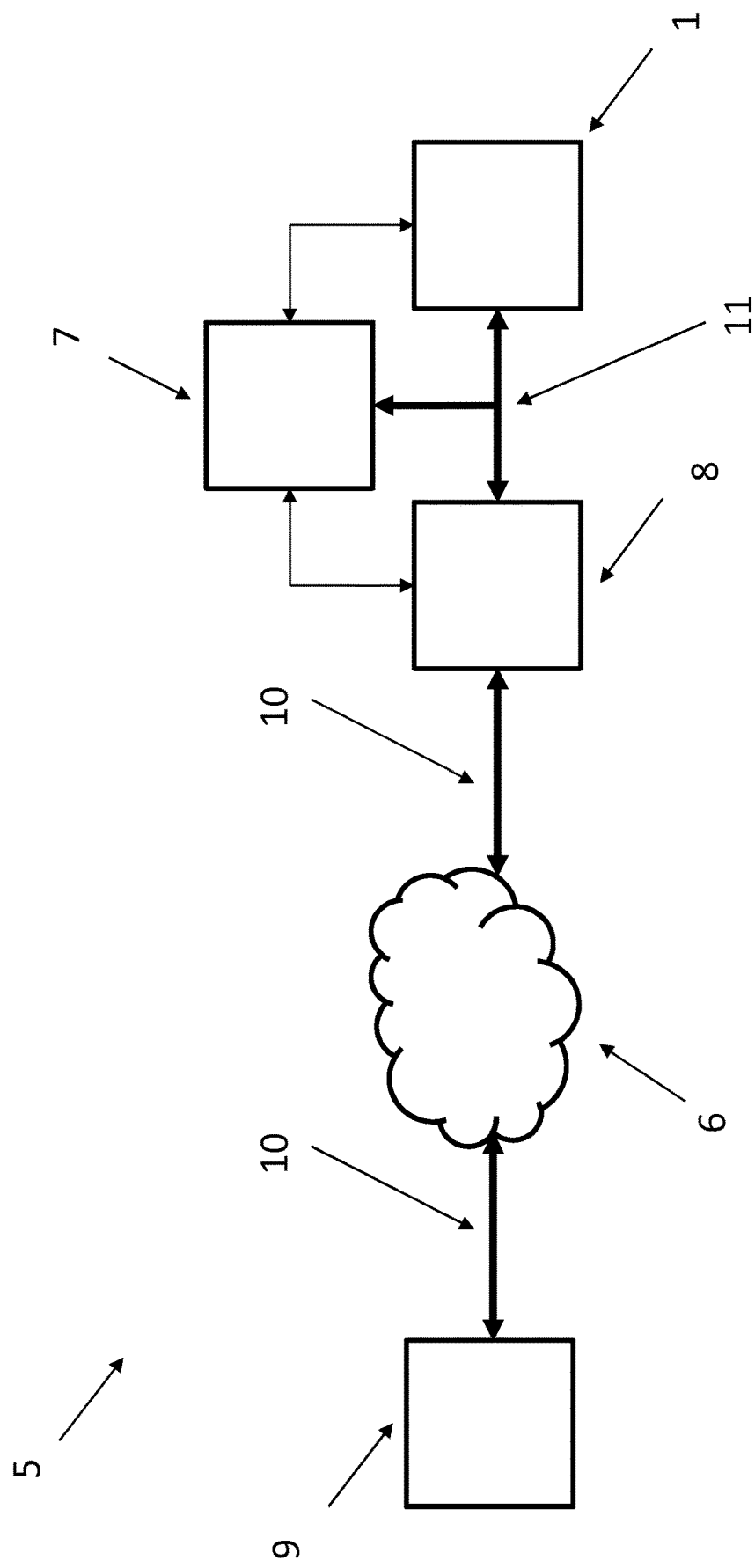
FIG. 8 shows a further schematic view of a network configuration for FPGA direct network boot according to an embodiment of the invention.

FIG. 8 shows a further schematic view of a network configuration 5 for FPGA direct network boot according to an embodiment of the invention. Here, advantageously the support for the layers-3 and 4 enables the possibility of an internet routed connection, where an application server may be located at an arbitrary geographical location, and nevertheless is able to directly program an FPGA 1 located at another arbitrary geographical location. As can be seen in FIG. 8, as an external master 9, a network server is connected via a high speed communications network 5, 10 to a PHY 8 which is connected to the FPGA 1 via a high speed digital bus 11. In between the PHY 8 and the FPGA 1, there is arranged the glue-logic 7, as in the previous embodiments.

The additional layers are used in order to the packet can transpose the network, however, that additional layers are fully removed by the glue-logic and the FPGA 1 receives only the relevant payload. Although the network transpose is possible via broadcast packets, the ARP protocol can be easily supported by the glue-logic via the "gratuitous ARP" scheme, where the glue-logic must store a minimal pre-configured ARP frame, which is periodically transmitted in broadcast to the network and is enough to fulfill the ARP caches in the network infra-structure.

Figure 9:
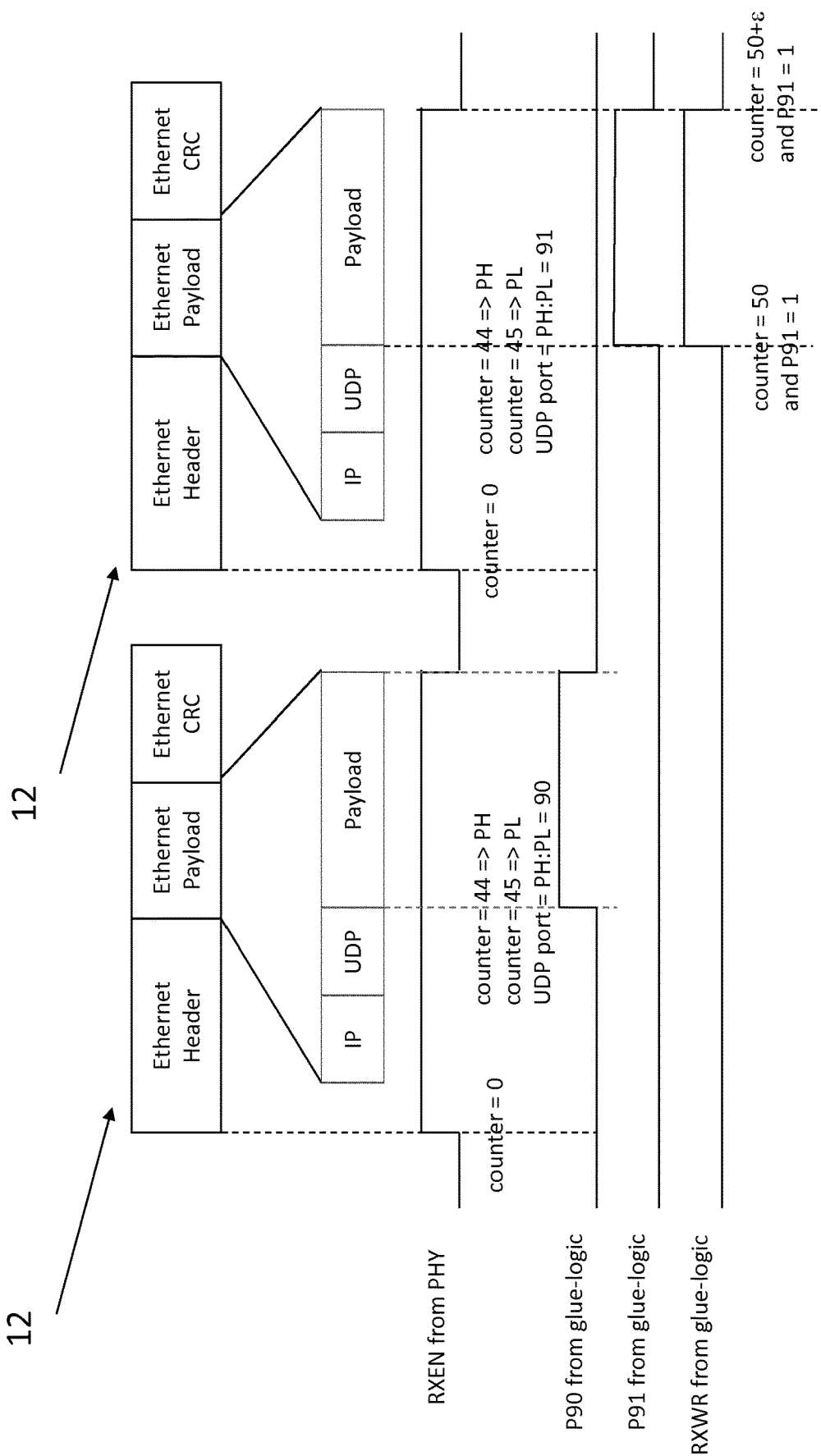
FIG. 9 shows a scheme for support for UDP control according to an embodiment of the invention.

FIG. 9 shows a scheme for support of UDP control according to an embodiment of the invention. Here, the support for additional headers uses almost the same logic, with a different counter calculation in order to skip the different headers and comparators in order to match different information in those headers. For example, with additional layer-4 support, for example UDP protocol, it is possible using different ports in order to differentiate commands from the programming payload itself. Also, it is possible to define first UDP ports (P90) for FPGA control (erase/program) and a second port (P91) for FPGA payload (FPGA programming image download), which changes the counter behavior to include the checking of the UDP destination port.

Figure 10:
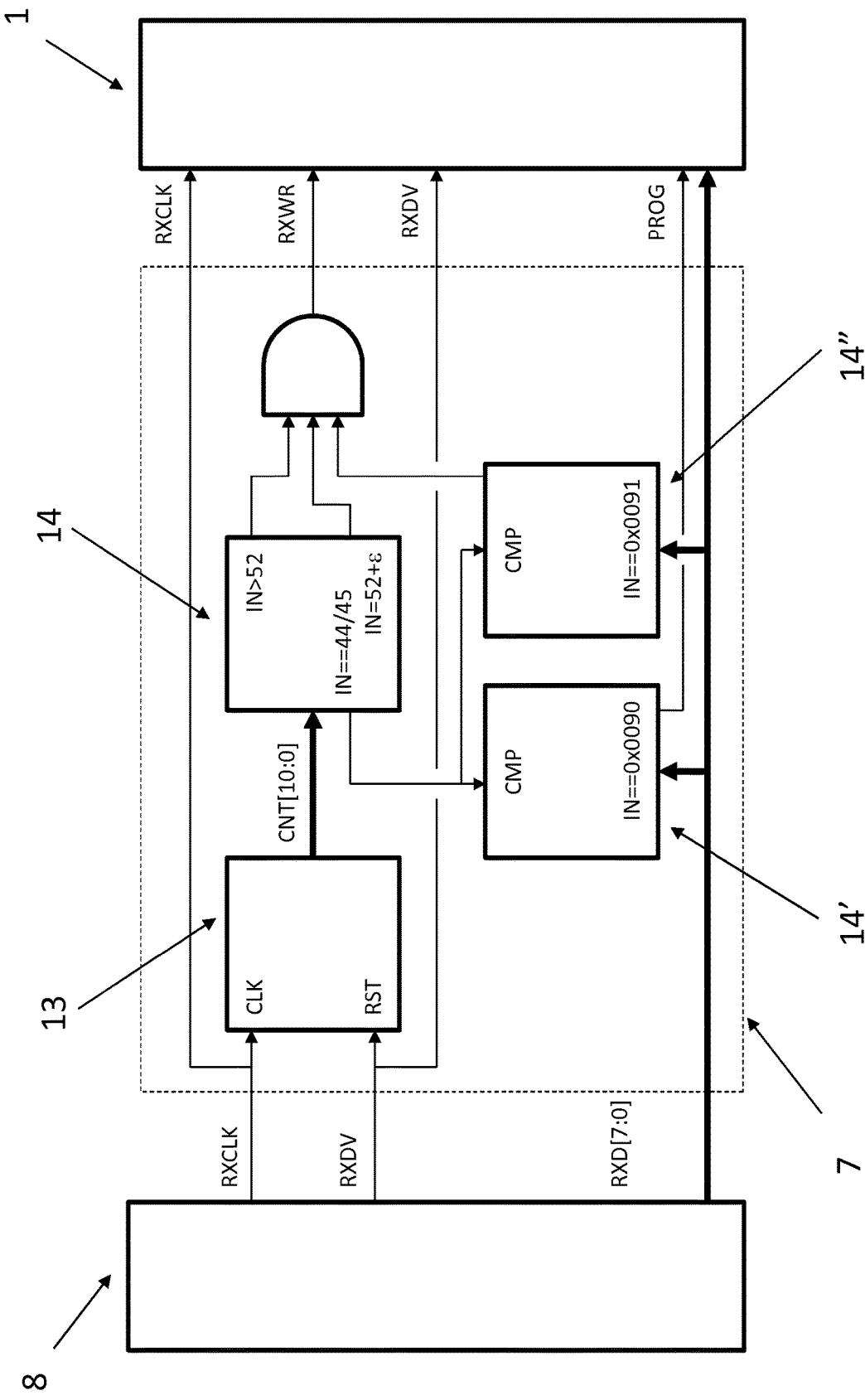
FIG. 10 shows a further schematic view of glue logic according to another embodiment of the invention.

FIG. 10 shows a further schematic view of glue logic 7 according to another embodiment of the invention. The choice by the ports 90 and 91 (see FIG. 9) is fully arbitrary and no specific ports are actually defined here. Instead, the protocol may be freely defined. However, in the example shown here, with an 11 bit counter 13 and four comparators 14, 14', 14", it is possible to parse the Ethernet frame, skip the headers, check the UDP port 90/91 and activate the erase/program of the FPGA 1 or download the payload. Of course, a more complete implementation might also check the layer-4 in the IP header in order to ensure the UDP protocol is not confused with a different layer-4 protocol.

This check depends on the application. For some applications, where the payload exchanged with the FPGA 1 is always UDP and the port usage excludes the ports 90/91, this checking is not fully required. Alternatively, it is possible to include the VLAN tag header and separate the programming/setup network from the operational network, which is used after the FPGA is programmed. Again, it is noted that the FPGA boot is not limited to any specific protocol or port.

Figure 11:
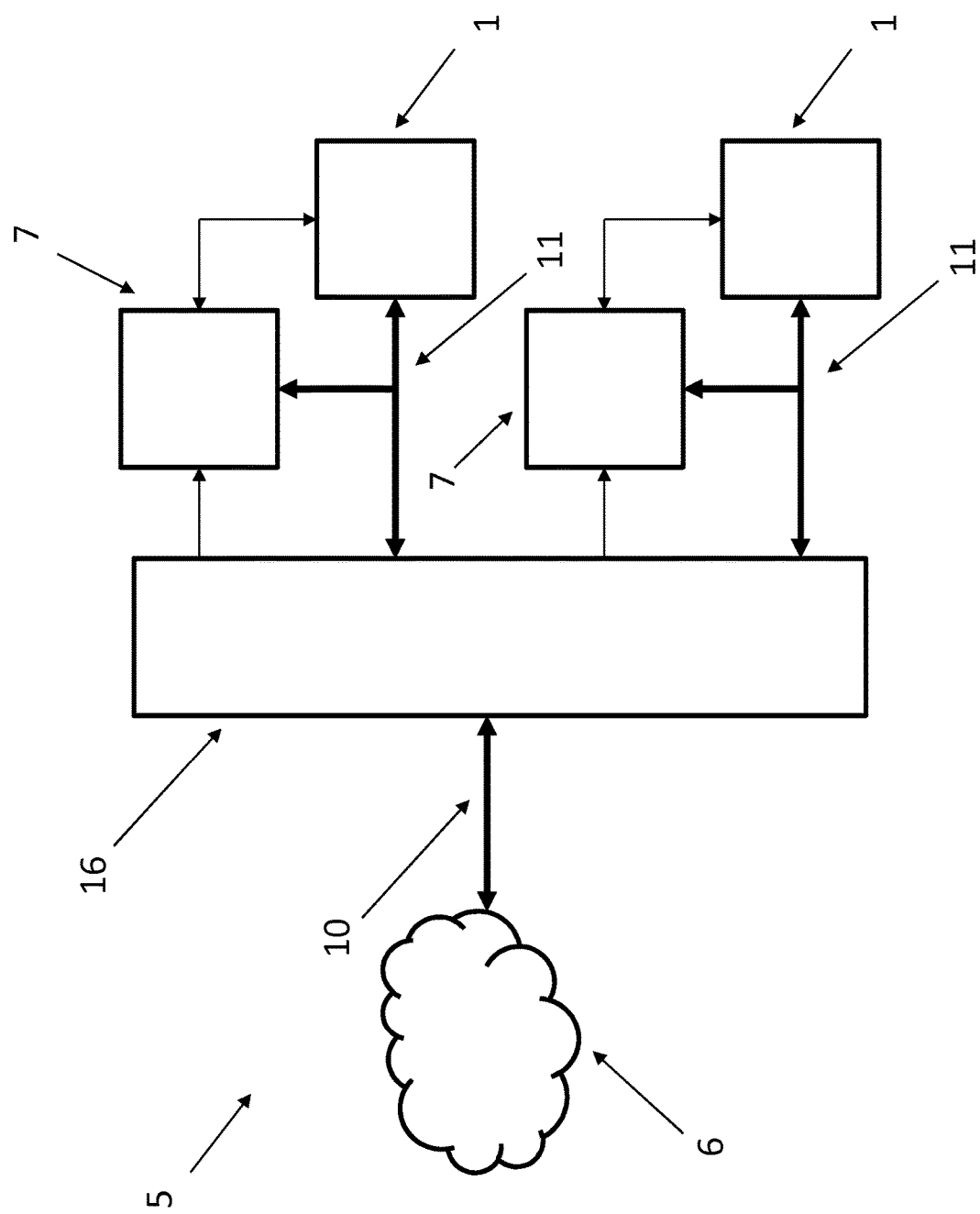
FIG. 11 shows still a further schematic view of a network configuration according to an embodiment of the invention.

FIG. 11 shows still a further schematic view of a network configuration 5 according to an embodiment of the invention. In this embodiment, multiple FPGAs 1 are provided and it is possible to connect the FPGAs 1 in the same GMII interface and use different UDP ports to control different FPGAs 1. It is noted that it is preferable to use one PHY 8 per FPGA 1. Alternatively, support for multiple FPGAs 1 can be achieved by checking the MAC address or the IP address, although it requires more comparators (six in the case of a MAC address and four in the case of an IP address).

Further, it is noted that in the simplest configuration, one single PHY 8 for programming and application traffic is employed and a dedicated PHY 8 for each function is recommended, in order to increase the network bandwidth for the application and isolate the management network in a different physical network. This is particularly important in the case of multiple FPGAs 1, where the management network will be used for a large number of FPGAs 1.

Although the glue-logic 7 is described in detail for some examples (just a counter 13 with some comparators 14 according to the desired level of support for different network layers), alternatively the glue-logic 7 may be provided by:

- discrete high speed logic (74F or better); and/or
- a small auxiliary CPLD/FPGA/ASIC with a pre-programmed image; or
- integrated in the main FPGA 1 by the manufacturer directly within the silicon area rather than in the programmable area.

With a smaller space requirement and support for high performance state of the art network technology, the proposed configuration enables the construction of large FPGA clusters composed by higher density boards. In this case, a mix of wired connections and backplane 17 (see FIG. 13) oriented connections may be required.

In the case of digital backplanes, the PHY 8 is not really needed, since the FPGA 1 may work in a PHY-less environment with a Processor Unit or Switch 16 interposed between the network 6 and the glue-logic 7 and FPGA 1, respectively. Although this configuration is almost the same as a direct FPGA download via a parallel interface in a backplane, the use a GMII interface is preferable compared to a direct parallel interface, since the GMII interface is connected to a high speed data path in the backplane, instead a slow parallel bus, as can be seen in FIG. 11.

Figure 12:
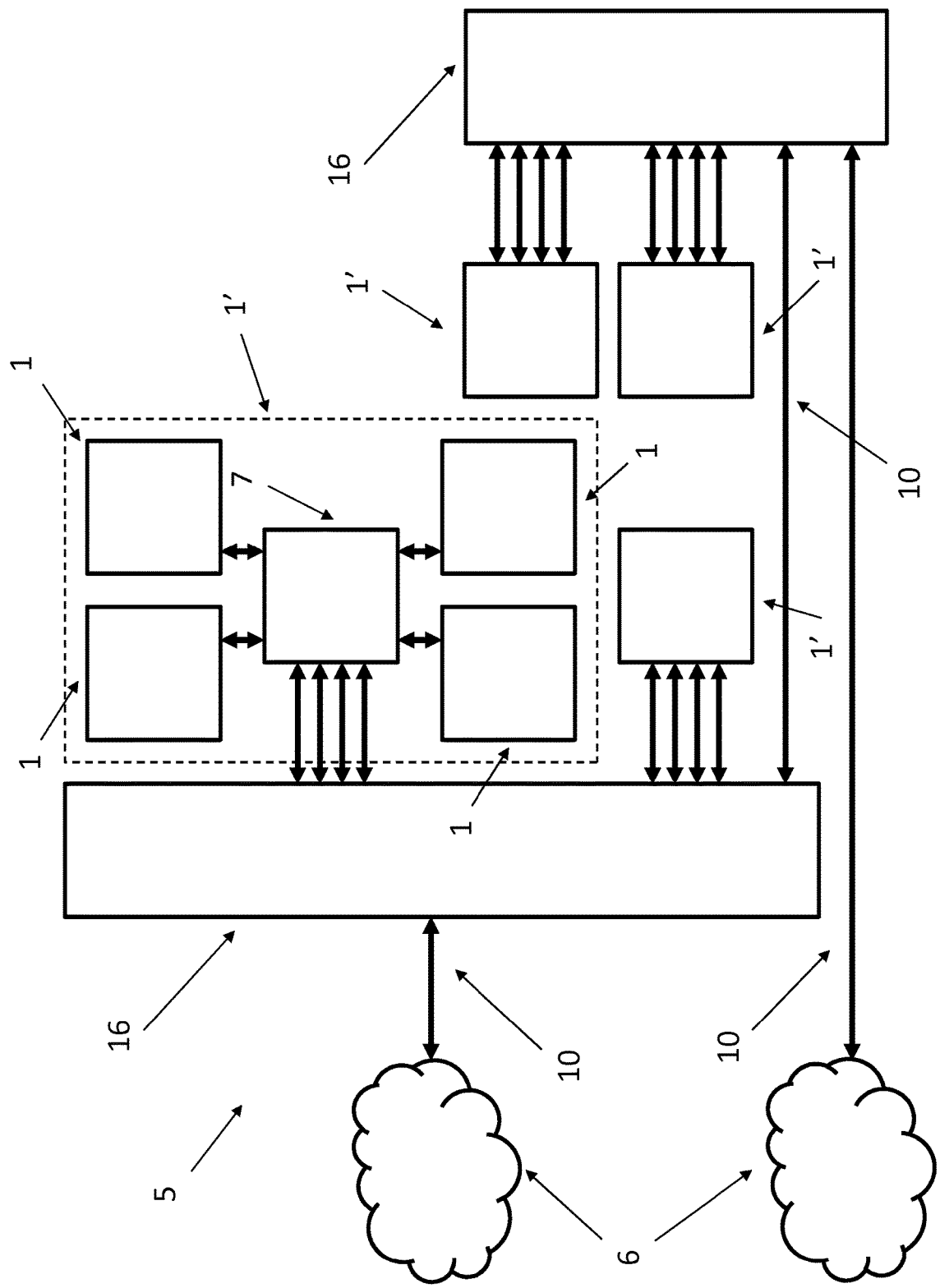
FIG. 12 shows still a further schematic view of a network configuration according to an embodiment of the invention.
Figure 13:
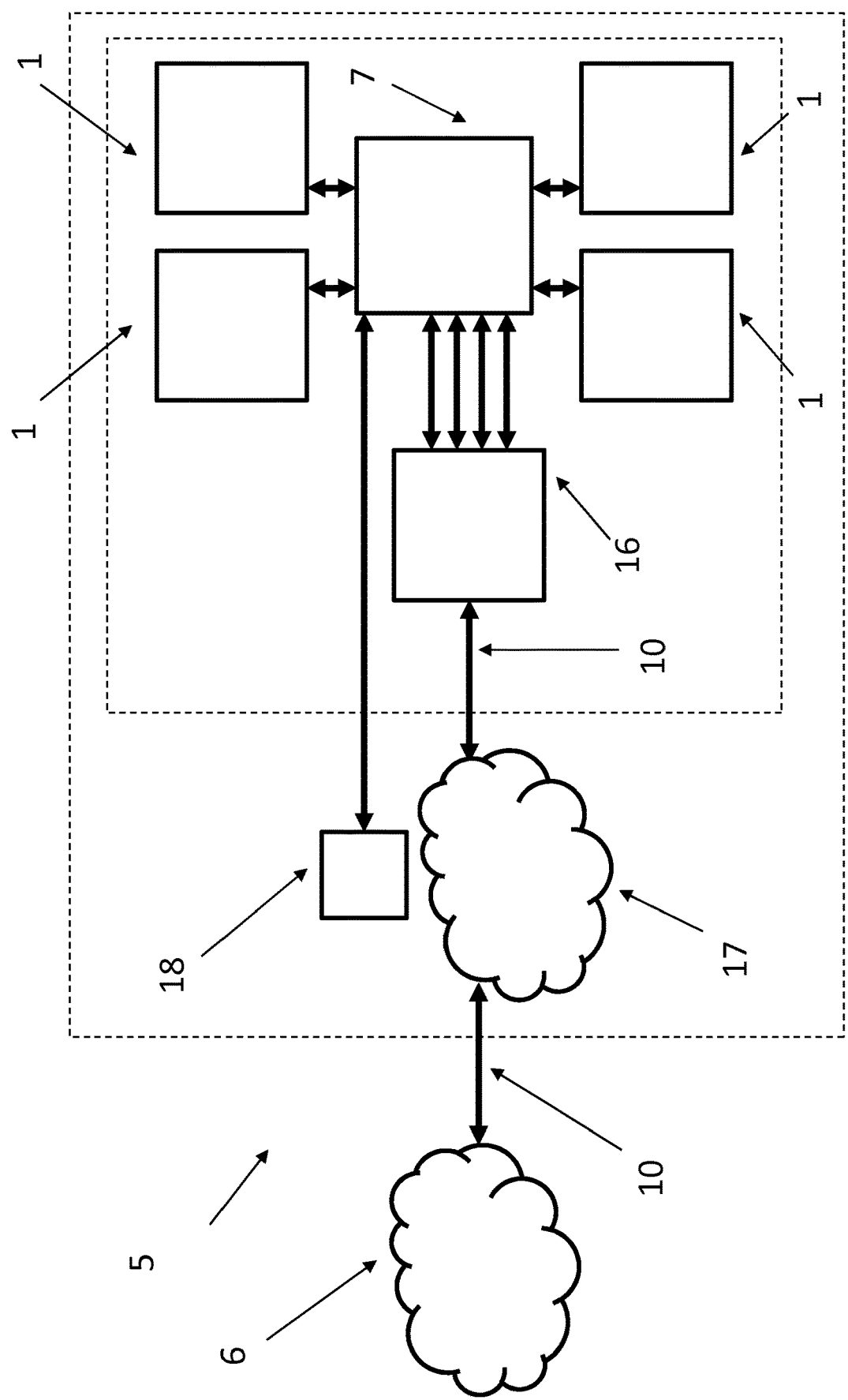
FIG. 13 shows still a further schematic view of a network configuration according to an embodiment of the invention

FIG. 12 shows still a further schematic view of a network configuration 5 according to an embodiment of the invention. Here, although not directly connected to a network 6, all network features are supported and some features can be more easily integrated in less space, for example, support of 4×FPGA groups 1' in a single auxiliary FPGA, which means this solution can easily scale for large FPGA clusters in a very compact construction FIG. 13 shows a still further schematic view of a network configuration 5 according to an embodiment of the invention. Here, the support for a high complex datacenter structure 15 with advanced security (such as payload and command cryptography), complex protocol support (such as ARP, ICMP, VLAN, etc.) can be easily provided by the glue-logic 7, although the modern FPGAs 1 also support the crypto-images by itself, such as the Xilinx Series-7, which supports the decoding of AES-256 images directly in the HW.

In this case, the glue-logic 7 can easily support more comparators 14, in a way all layers are supported. In this case, individual MAC addresses, crypto-keys and other features can be semi-automatically configured. For example, the first 24 bits from the MAC address can be fixed in the glue-logic 7, the middle 16 bits defined from a shelf ID stored in a non-volatile memory, with the last 8 bits defined in the FPGA board such that 4 bits are defined according to the board position in the shelf 18 (slot 0-15) and the remaining 4 bits are the number of the FPGA in the board. The cryptographic key can be defined in a similar way or exchanged via more complex protocols.

While certain exemplary embodiments of FPGAs, apparatuses, networks, and communication systems and methods of making and using the same have been discussed and illustrated herein, it is to be distinctly understood that the invention is not limited thereto but may be otherwise variously embodied and practiced within the scope of the following claims.

The invention claimed is:

1. A method for programming a Field Programmable Gate Array (FPGA) via a network being operated according to a predetermined communications protocol, the method comprises comprising:

establishing, via the network, a communications connection between the FPGA and an external master connected to the network;

setting the FPGA into a programming mode;

the FPGA receiving an FPGA programming image for programming the FPGA from the external master according to the predetermined network communications protocol in a sequence of frames, each of the frames comprising a payload section and protocol overhead section, each payload section comprising a portion of the programming image;

parsing the sequence of frames; and enabling FPGA writing only during receiving of the payload section of each of the frames received and writing a portion of programming data of the payload section into the FPGA, wherein the receiving of the FPGA programming image and parsing of the sequence of frames is performed by a permanently programmed or hardwired logic component;

wherein the logic component is circuitry, the circuitry being a glue logic type comprising a digital counter and at least one comparator provided between an Ethernet physical layer (PHY) and the FPGA; and the method also comprising:

the logic component, during programming of the FPGA, generating a Receive Write signal while the counter is between a defined range between $\tau$ and $\tau+\varepsilon$, where $\varepsilon$ is payload length and $\tau$ is a number of bytes of network headers that is to be skipped.

2. The method according to claim 1, wherein the predetermined network communications protocol is an Ethernet protocol.

3. The method of claim 1, further comprising:

after a predetermined number of the frames that are sufficient for loading a valid FPGA configuration image has been received, assuming, by the FPGA, control of an interface between the external master and the FPGA and starting an exchange of traffic with the external master.

4. The method of claim 3, wherein the interface is a gigabit media-independent Interface (GMII) interface.

5. The method of claim 3, further comprising:

disabling the FPGA image download after starting the exchange of traffic.

6. The method of claim 3, wherein the external master is a network server with the Ethernet PHY directly attached thereto.

7. A method for programming a Field Programmable Gate Array (FPGA) via a network being operated according to a predetermined communications protocol, the method comprises comprising:

establishing, via the network, a communications connection between the FPGA and an external master connected to the network;

setting the FPGA into a programming mode;

the FPGA receiving an FPGA programming image for programming the FPGA from the external master according to the predetermined network communications protocol in a sequence of frames, each of the frames comprising a payload section and protocol overhead section, each payload section comprising a portion of the programming image;

parsing the sequence of frames; and enabling FPGA writing only during receiving of the payload section of each of the frames received and writing a portion of programming data of the payload section into the FPGA, wherein the receiving of the FPGA programming image and parsing of the sequence of frames is performed by a permanently programmed or hardwired logic component and re-programming the FPGA, the FPGA erasing itself to facilitate the re-programming by triggering an IO pin connected to a RESET pin so as to stop an exchange of traffic between the FPGA and the external master.

8. The method according of claim 7, wherein the logic component is circuitry.

9. The method of claim 8, wherein the circuitry is a glue logic type, PLA type, or PLD type.

10. The method of claim 9, wherein the logic component is the glue type logic, the glue logic type comprising a digital counter and at least one comparator provided between an Ethernet physical layer (PHY) and the FPGA.

11. The method of claim 10, comprising:

the logic component, during programming of the FPGA, generating a Receive Write signal (RXWR) while the counter is between a defined range between $\tau$ and $\tau+\varepsilon$, where $\varepsilon$ is payload length and $\tau$ is a number of bytes of network headers that is to be skipped.

12. The method of claim 10, wherein the counter is a 10-bit counter.

13. A communication apparatus comprising:

a communications network in which an external master and an FPGA are connected to each other via an interface, and are adapted to communicate with each other according to a predetermined network communications protocol;

the FPGA configured to boot itself directly from the network, a logic component being positioned between the FPGA and the interface, wherein the logic component comprises circuitry, the circuitry comprising a digital counter and at least one comparator provided between an Ethernet physical layer (PHY) and the FPGA, the logic component configured so that, during programming of the FPGA, a Receive Write signal is generated while the counter is between a defined range between $\tau$ and $\tau+\varepsilon$, where $\varepsilon$ is payload length and $\tau$ is a number of bytes of network headers that is to be skipped.

14. The communication apparatus of claim 13, wherein the logic component is circuitry configured as a glue logic type.

15. The communication apparatus of claim 13, wherein the external master is a network server, the predetermined network communications protocol is Ethernet, and the interface is a gigabit media-independent Interface (GMII) interface.

16. The communication apparatus of claim 13, wherein the logic component comprises at least one of discrete high speed logic and an auxiliary component with a pre-programmed programming image, the auxiliary component being an auxiliary Complex Programmable Logic Device CPLD, an auxiliary FPGA, or an auxiliary Application-Specific Integrated Circuit ASIC.

17. The communication apparatus of claim 16, wherein the auxiliary component is connected to the FPGA between the FPGA and the interface.

18. The communication apparatus of claim 13, wherein the communication apparatus is configured to support a physical layer protocol, VLAN protocols, routing protocols, and transport protocols.

19. The communication apparatus of claim 13, wherein the FPGA is configured so that during re-programming of the FPGA, the FPGA erases itself to facilitate the re-programming by triggering an IO pin connected to a RESET pin so as to stop an exchange of traffic between the FPGA and the external master.

* * * * *